United States Patent
Kakegawa

(10) Patent No.: US 7,804,170 B2
(45) Date of Patent: Sep. 28, 2010

(54) SEMICONDUCTOR DEVICE AND METHOD OF DESIGNING THE SAME

(75) Inventor: Chika Kakegawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/458,277

(22) Filed: Jul. 7, 2009

(65) Prior Publication Data

US 2010/0025841 A1 Feb. 4, 2010

(30) Foreign Application Priority Data

Jul. 29, 2008 (JP) ............... 2008-194914

(51) Int. Cl.
*H01L 23/34* (2006.01)
*H01L 23/02* (2006.01)

(52) U.S. Cl. .......... 257/723; 257/678; 257/685; 257/E23.001

(58) Field of Classification Search ......... 257/678, 257/685, 723, E23.001
See application file for complete search history.

(56) References Cited

U.S. PATENT DOCUMENTS 6,979,905 B2 * 12/2005 Nishida et al. ............. 257/777
7,247,950 B2 * 7/2007 Fujisawa et al. ............ 257/778
2004/0164385 A1 * 8/2004 Kado et al. ................. 257/678
2005/0168960 A1 * 8/2005 Asahi et al. ................ 361/761
2007/0110359 A1 * 5/2007 Okubora .................... 385/14
2008/0001310 A1 * 1/2008 Sathe et al. ................ 257/787

FOREIGN PATENT DOCUMENTS

JP 62-37964 3/1987

* cited by examiner

*Primary Examiner*—Ida M Soward
(74) *Attorney, Agent, or Firm*—McGinn IP Law Group, PLLC

(57) ABSTRACT

A semiconductor device contains an interposer having a square planar geometry, with length X for a first edge and length Y for a second edge orthogonal to the first edge, and a semiconductor chip and a dummy component disposed over the interposer, wherein the center of a first outer circumferential region, which surrounds the semiconductor chip over the interposer, and has length "a" for a third edge, and length "b" for a fourth edge, does not coincide with the center of the interposer, or equation X:Y=a:b is not satisfied, and the center of a second outer circumferential region, which surrounds the first outer circumferential region and the dummy components disposed over the interposer, and has length "x" for a fifth edge, and length "y" for a sixth edge, coincides with the center of the interposer, and equation X:Y=x:y is satisfied.

6 Claims, 19 Drawing Sheets

FIG. 17

| SOLDER LIFETIME | (EXAMPLE 1) | (EXAMPLE 2) |
|---|---|---|
| SHORTEST LIFETIME | 1200 | 1000(REFERENCE) |
| CENTER | 2200 | 1300 |
| CHIP CORNERS | 1500 | 1400 |
| INTERPOSER CORNERS | 3200 | 3000 |

SEMICONDUCTOR DEVICE AND METHOD OF DESIGNING THE SAME

This application is based on Japanese patent application No. 2008-194914 the content of which is incorporated hereinto by reference.

BACKGROUND

1. Technical Field

The present invention relates to a semiconductor device and a method of designing the same, and in particular to a semiconductor device having an interposer and a semiconductor chip disposed thereon, and a method of designing the same.

2. Related Art

Semiconductor packages are generally configured by mounting an interposer on a mounting substrate while placing solder balls in between, and by disposing semiconductor chip(s) further thereon. However, there has been known a problem of deformation of semiconductor packages due to unbalanced stress exerted by the semiconductor chip(s) to the interposer, for the case where the semiconductor chip(s) have a rectangular geometry in a plan view, or for the case where the center of the interposer does not coincide with the center of the semiconductor chip(s). This sort of deformation may cause warping or other non-conformities of the interposer, and may degrade lifetime of connection by the solder balls between the interposer and the mounting substrate.

Japanese Laid-Open Utility Publication No. S62-37964 describes a printed circuit board having a protective substrate bonded to the surface thereof on the component-mounting side, wherein the protective substrate is provided with through-holes corresponding to the position of attachment of components to be mounted, so as to incorporate the components therein.

However, in the technique described in Japanese Laid-Open Utility Publication No. S62-37964, any alteration in layout of the components to be mounted (semiconductor chip, and so forth) inevitably needs alteration of geometry of the protective substrate, and therefore raises a problem of limited degree of freedom in design, and large cost.

SUMMARY

According to the present invention, there is provided a semiconductor device which includes: an interposer having a rectangular planar geometry with length X for a first edge and length Y for a second edge orthogonal to the first edge; a semiconductor chip disposed over the interposer; and a dummy component disposed over the interposer, alongside of the semiconductor chip, wherein the center of a first outer circumferential region, which surrounds the semiconductor chip over the interposer, and has length "a" for a third edge lying in parallel with the first edge, and length "b" for a fourth edge orthogonal to the third edge, does not coincide with the center of the interposer, or equation $X:Y=a:b$ is not satisfied, and the center of a second outer circumferential region, which surrounds the first outer circumferential region and the dummy component disposed over the interposer, and has length "x" for a fifth edge lying in parallel with the first edge, and length "y" for a sixth edge orthogonal to the fifth edge, coincides with the center of the interposer, and equation $X:Y=x:y$ is satisfied.

According to the present invention, there is provided also a method of designing a semiconductor device which has an interposer having a rectangular planar geometry with length X for a first edge and length Y for a second edge orthogonal to the first edge, and a semiconductor chip disposed over the interposer, the method including: acquiring a layout information which expresses individual planar geometries of the interposer and the semiconductor chip, and a positional relation between the interposer and the semiconductor chip; determining a second outer circumferential region based on the layout information, if the center of a first outer circumferential region which surrounds the semiconductor chip over the interposer, and has length "a" for a third edge lying in parallel with the first edge, and length "b" for a fourth edge orthogonal to the third edge, does not coincide with the center of the interposer, or does not satisfy equation $X:Y=a:b$, the second outer circumferential region having the center coincident with the center of the interposer, containing the first outer circumferential region in a plan view, having length "x" for a fifth edge lying in parallel with the first edge, having length "y" for a sixth edge orthogonal to the fifth edge, and satisfying equation $X:Y=x:y$ in a plan view; and making a setting for disposing, in the second outer circumferential region, a dummy component alongside of an area where the semiconductor chip is disposed.

Here, the semiconductor device may include one or more of the semiconductor chip(s) and one or more of the dummy component(s). According to these configurations, one or more of the dummy component(s) may be disposed so as to ensure a good positional balance relative to the planar geometry of the interposer, so that any unbalance in stress apprehensive for the interposer when only one or more of the semiconductor chip(s) is disposed may be resolved, and thereby the interposer may be prevented from asymmetrically warping. As a consequence, unbalanced warping of the semiconductor device due to thermal load may be reduced, and thereby a package structure excellent in the reliability of mounting may be provided.

Note that also any arbitrary combinations of the above-described constituents, and any exchanges in expressions of the present invention among method, device and so forth may be effective as embodiments of the present invention.

According to the present invention, unbalanced stress possibly exerted to an interposer by the semiconductor chip disposed thereon may be moderated by a simple method.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 17 is a drawing listing lifetime of solder at individual portions calculated by the simulation;

DETAILED DESCRIPTION

Figure 1A:
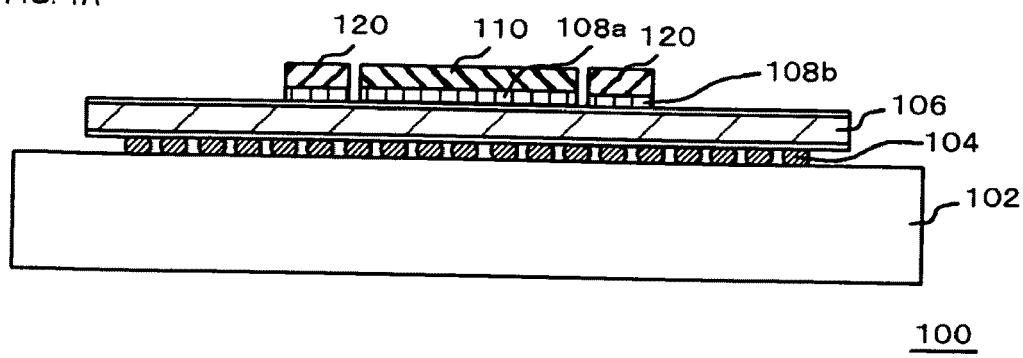
FIGS. 1A and 1B are sectional views illustrating a configuration of a semiconductor device according to an embodiment of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that any similar constituents will be given with similar reference numerals in all drawings, and explanations therefore will not be repeated.

First Embodiment

Figure 1B:
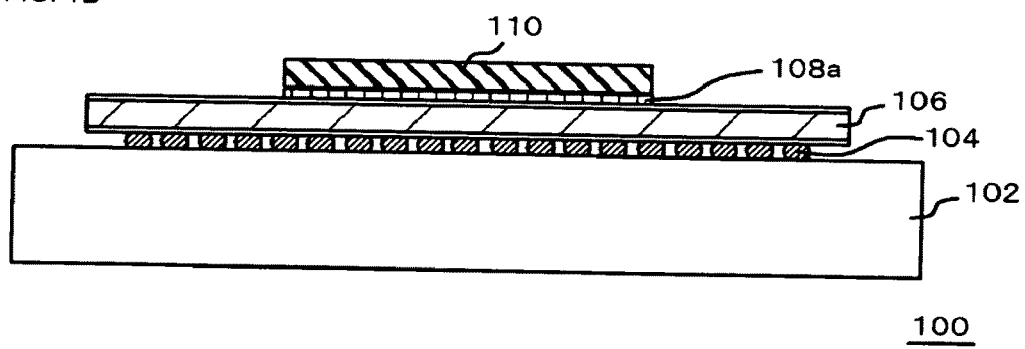

FIGS. 1A and 1B are sectional views illustrating a configuration of a semiconductor device of this embodiment.

Figure 2A:
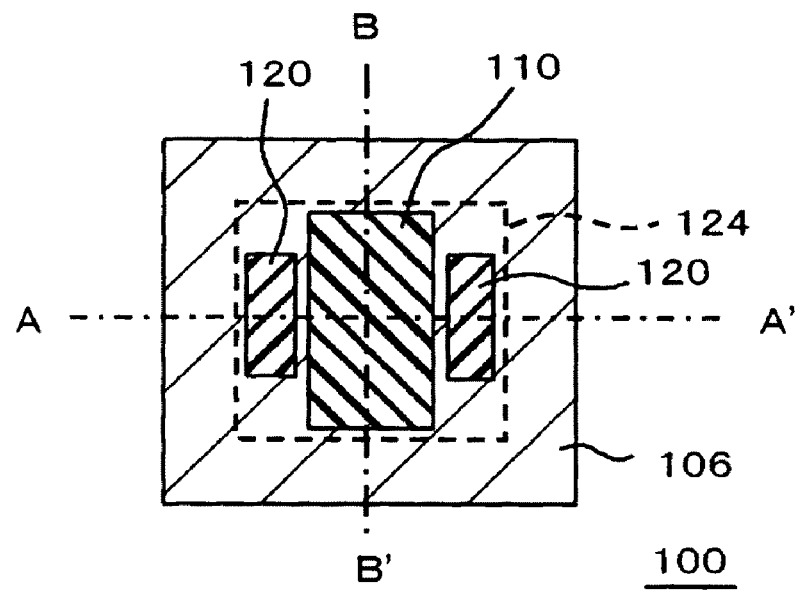
FIGS. 2A and 2B are plan views illustrating a configuration of the semiconductor device according to the embodiment of the present invention.
Figure 2B:
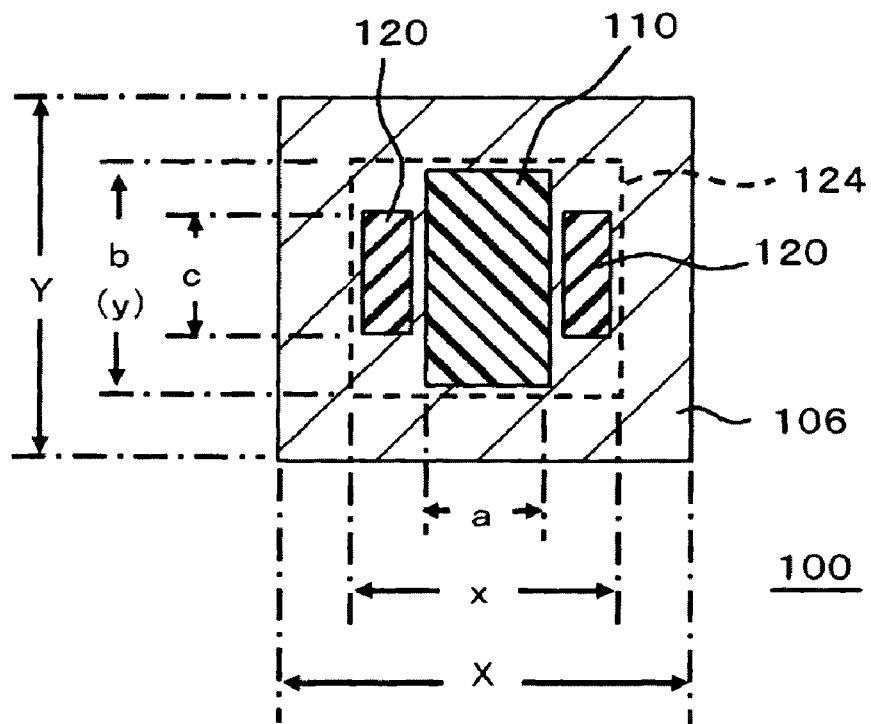

FIGS. 2A and 2B are plan views of the semiconductor device 100. FIG. 1A corresponds to a sectional view taken along line A-A' in FIG. 2A, and FIG. 1B corresponds to a sectional view taken along line B-B' in FIG. 2A. Dimensions of the individual components of a semiconductor device are given in FIG. 2B.

The semiconductor device 100 contains a mounting substrate 102, an interposer 106 mounted over the mounting substrate 102 while placing solder balls 104 in between, and a semiconductor chip 110 disposed over the interposer (wiring board) 106. In this embodiment, the semiconductor device 100 may be a semiconductor package configured to have the interposer 106 mounted by surface mounting using the solder balls 104 onto the mounting substrate 102 such as FCBGA (Flip Chip Ball Grid Array), PBGA (Plastic Ball Grid Array), and FPBGA (Fine Pitched Ball Grid Array).

In this embodiment, if the semiconductor chip 110 to be mounted over the interposer 106 has a rectangular geometry, having a longer edge and a shorter edge and not a for square, in a plan view, or if the semiconductor chip 110 is not mounted at the center of the interposer 106, dummy components 120 may be disposed at positions capable of moderating asymmetry and unbalance of the semiconductor chip 110 with respect to the interposer 106. In this way, unbalanced stress which may otherwise be exerted by the semiconductor chip 110 to the interposer 106 when only the semiconductor chip 110 is mounted may be moderated, so that unbalanced warping of the whole semiconductor device 100 may be improved, and thereby the semiconductor device 100 excellent in reliability of mounting may be obtained.

In this embodiment, the semiconductor device 100 contains two dummy components 120 provided alongside of the semiconductor chip 110 over the interposer 106. Two dummy components 120 are disposed one by one on both sides of the semiconductor chip 110. In this embodiment, the semiconductor chip 110 may be configured to be connected with the interposer 106 by flip-chip bonding (terminals are not illustrated). An underfill 108a is provided between the semiconductor chip 110 and the interposer 106. A mounting component 108b is provided between each dummy component 120 and the interposer 106.

The interposer 106 has a rectangular planar geometry. The interposer 106 has length X for a first edge which lies in the transverse direction of the drawing, and has length Y for a second edge, orthogonal to the first edge, which lies in the longitudinal direction of the drawing. The relation X>Y now holds.

In this embodiment, also the semiconductor chip 110 has a rectangular planar geometry. The semiconductor chip 110 has length "a" for the edge which lies in the transverse direction of the drawing, and has length "b" for the edge which lies in the longitudinal direction. Since the interposer 106 herein has only one semiconductor chip 110 disposed thereon, so that the geometry of a first outer circumferential region, which surrounds an area of the interposer 106 having the semiconductor chip 110 disposed therein, coincides with the geometry of the semiconductor chip 110. The first outer circumferential region has length "a" for a third edge which lies in the transverse direction of the drawing, and has length "b" for a fourth edge, orthogonal to the third edge, which lies in the longitudinal direction of the drawing. The third edge herein is parallel with the first edge of the interposer 106. Relation a<b now holds.

Accordingly, the relation X:Y=a:b is not satisfied in this embodiment. The geometry of the semiconductor chip 110 is not analogous to that of the interposer 106 in a plan view, while aligning the longitudinal direction thereof in the same direction. In this configuration, the interposer 106, simply provided thereon only with the semiconductor chip 110, may cause unbalanced stress exerted by the semiconductor chip 110.

In this embodiment, in order to moderate the unbalanced stress, two dummy components 120 are disposed one by one on both sides of the semiconductor chip 110 over the interposer 106. The dummy components 120 are disposed so as to make a second outer circumferential region 124, designated by an outer circumference which surrounds the semiconductor chip 110 (first outer circumferential region) and the dummy components 120 in a plan view, analogous to the geometry of the interposer 106 having the longitudinal direction thereof aligned in the same direction, and so as to make the center of the second outer circumferential region 124 coincidence with the center of the interposer 106. The second outer circumferential region 124 has length x in the transverse direction of the drawing, and length y=b in the longitudinal direction. The second outer circumferential region 124 may be set so as to satisfy the relation X:Y=x:y.

The dummy components 120 may be configured by a material having mechanical characteristics and coefficient of thermal expansion equivalent to those of the semiconductor chip 110. For example, the dummy components 120 may be components composed of silicon, ceramic, or a metal material. Copper, nickel and so forth may be adoptable as the metal material. Alternatively, the dummy components 120 may be configured by dummy semiconductor chips which are not electrically connected to other constituents. The dummy semiconductor chips are not electrically connected to the interposer 106. Still alternatively, the dummy components 120 may be configured by passive components such as capacitors.

Materials adoptable to compose the dummy components 120, other than those described in the above, include alumina, silicon carbide, aluminum nitride, and copper-tungsten.

As the materials composing the dummy components 120, those typically having a coefficient of heat expansion not larger than 20 ppm/K, which is a value of the interposer 106 (heat-resistant), may be adoptable. The material adoptable to compose the dummy components 120 may be also those having an elastic modulus of not smaller than 20 GPa or around, which is a value of the interposer 106 (core material). The material composing the dummy components 120 may be such as having a coefficient of thermal expansion of approximately 3 ppm/K or larger and 20 ppm/K or smaller. The material composing the dummy components 120 may be such as having an elastic modulus of approximately 20 GPa or larger and 333 GPa or smaller.

Figure 3A:
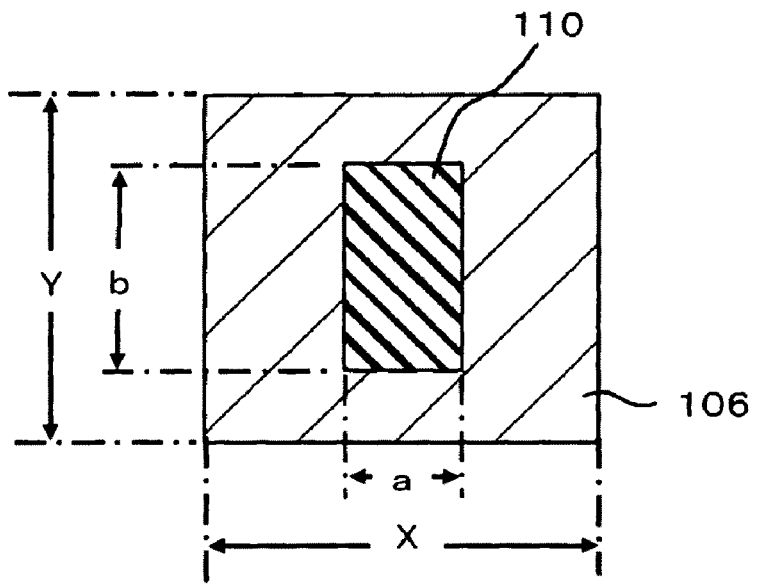
FIGS. 3A to 3C are drawings illustrating procedures of designing the semiconductor device according to the embodiment of the present invention.
Figure 3B:
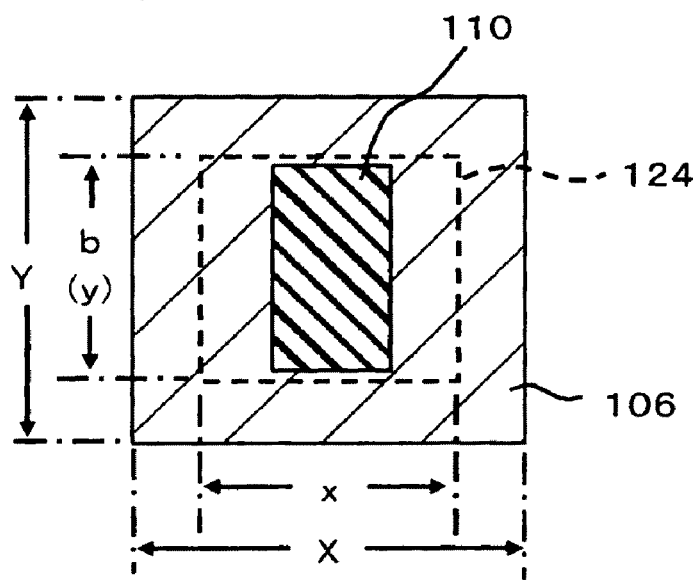
Figure 3C:
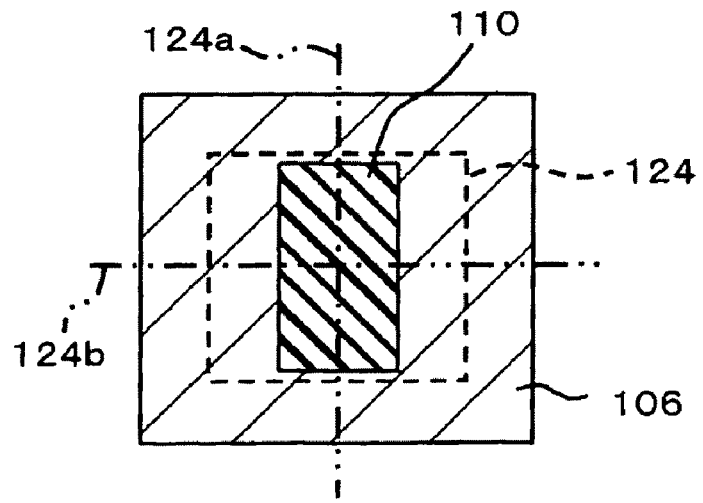

Next, procedures of designing the semiconductor device 100 of this embodiment will be explained referring to FIGS. 3A to 3C.

First, a layout information which describes the individual planar geometries of the interposer 106 and the semiconductor chip 110, and a positional relation between the interposer 106 and the semiconductor chip 110 is obtained. FIG. 3A schematically illustrates the layout information. In this example, the center of the interposer 106 and the center of the semiconductor chip 110 coincide.

Based on the layout information, whether the first region (same as the semiconductor chip 110 in this embodiment), which surrounds an area of the interposer 106 having the semiconductor chip 110 disposed therein, and has length "a" for a third edge lying in parallel with the first edge, and length "b" for a fourth edge orthogonal to the third edge in a plan view, has the center coincident with the center of the interposer 106 or not, or satisfies the relation X:Y=a:b or not is judged. If the first outer circumferential region has the center coincident with the center of the interposer 106, and the relation X:Y=a:b is satisfied, there is no need of disposing the dummy component 120, since the stress exerted by the semiconductor chip 110 to the interposer 106 may be balanced. On the other hand, if the first outer circumferential region has the center not coincident with the center of the interposer 106, or does not satisfy the relation X:Y=a:b, the second outer circumferential region 124, which has the center coincides with the center of the interposer 106, surrounds the first outer circumferential region, has length x for a fifth edge in parallel with the first edge, has length y for a sixth edge orthogonal to the fifth edge, and satisfies the relation X:Y=x:y, is set.

In this embodiment, the relation X:Y=a:b is not satisfied. For this reason, there is a need for setting the second outer circumferential region 124 allowing therein disposition of the dummy components 120. FIG. 3B is a drawing illustrating a state of setting of the second outer circumferential region 124. The second outer circumferential region 124 may have a minimum size capable of enclosing the first outer circumferential region (the area allowing disposition of the semiconductor chip 110). More specifically, the second outer circumferential region 124 in this embodiment is set so as to make length x in the transverse direction of the drawing equal to length b of the semiconductor chip 110. Length x of the second outer circumferential region 124 in the transverse direction may be calculated from the relation X:Y=x:b. This way of setting of the second outer circumferential region 124 may be cost-saving.

Next, a setting is made to dispose the dummy components 120 in the second outer circumferential region 124 but outside the first outer circumferential region. The dummy components 120 may be set so as to make an area, having the semiconductor chip 110 and the dummy components 120 disposed therein, symmetrical about both of a first center line 124a in the longitudinal direction of the second outer circumferential region 124 and a second center line 124b in the transverse direction, in a plan view. By this setting, unbalanced stress apprehensive for the interposer 106 may be moderated. The semiconductor chip 110 or the dummy components 120 may preferably be disposed over the region extended up to the outer edges of the second outer circumferential region 124, on the first center line 124a in the longitudinal direction of the second outer circumferential region 124 and on the second center line 124b in the transverse direction.

In this embodiment, the setting may be made so as to dispose the dummy components 120 on the second center line 124b. Length "c" of the dummy components 120 in the longitudinal direction may be set equal to length "a" in the transverse direction of the semiconductor chip 110. By this setting, the unbalanced stress apprehensive for the interposer 106 may be moderated.

Figure 4:
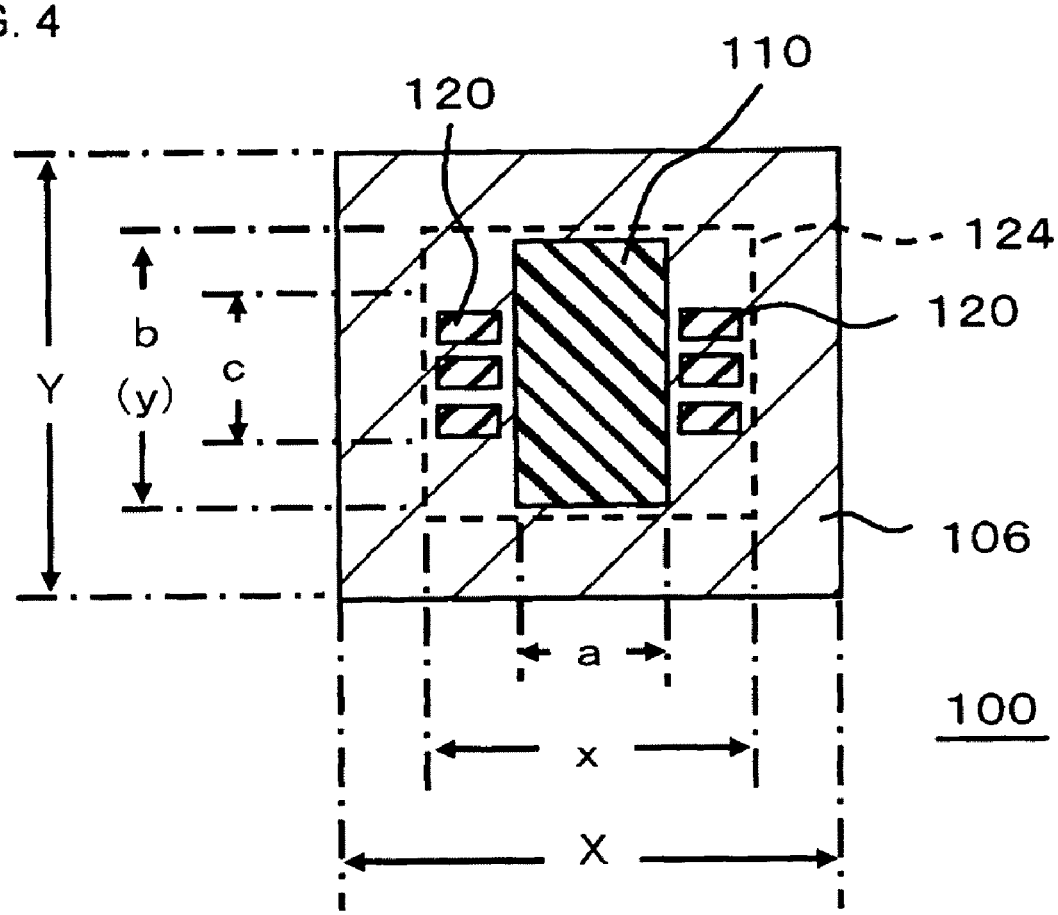
FIG. 4 is a plan view illustrating a modified example of the semiconductor device illustrated in FIGS. 2A and 2B.

FIG. 4 is a plan view illustrating a modified example of the semiconductor device 100 illustrated in FIGS. 2A and 2B.

Each dummy component 120 has a size smaller than that illustrated in FIGS. 2A and 2B. However, the dummy components 120 herein, increased in the number of disposition, may be disposed so as to assimilate the overall contour of each dummy component 120 illustrated in FIGS. 2A and 2B. For an exemplary case where passive components such as capacitors are used as the dummy components, a plurality of dummy components may be disposed so as to fit them to the geometry of the unoccupied area of the second outer circumferential region 124.

Figure 5A:
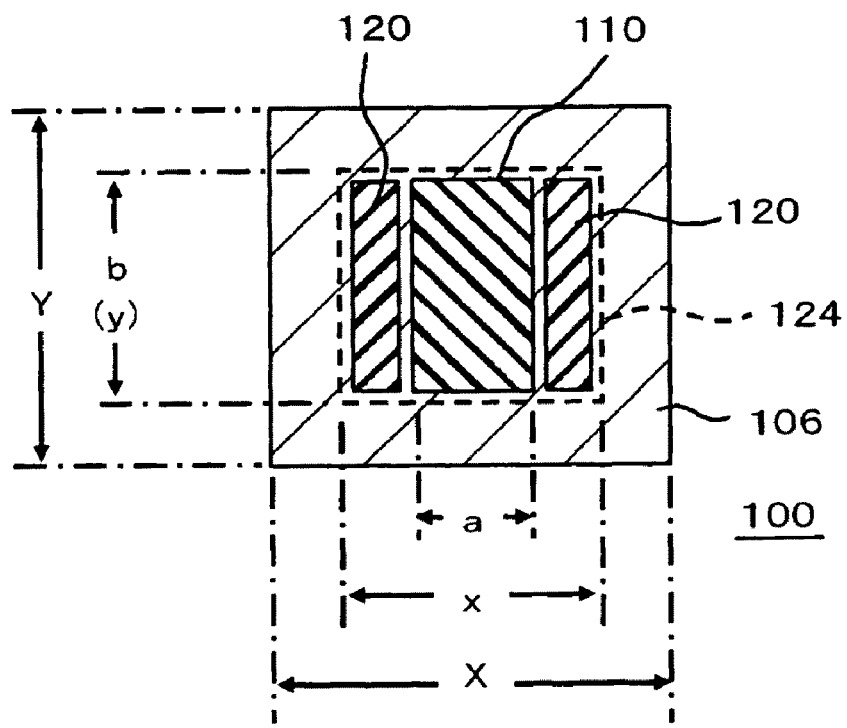
FIGS. 5A and 5B are plan views illustrating modified examples of the semiconductor device illustrated in FIGS. 2A and 2B.
Figure 5B:
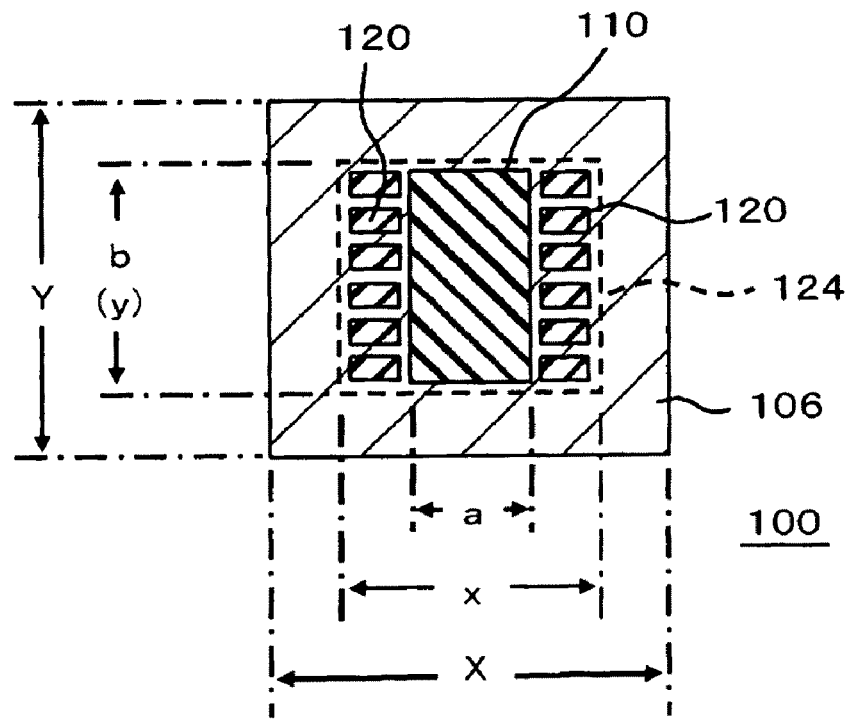

FIGS. 5A and 5B are plan views of other modified examples of the semiconductor device 100 illustrated in FIGS. 2A and 2B.

The dummy components 120 herein are disposed over the entire area of the second outer circumferential region 124 but outside the first outer circumferential region.

In FIG. 5A, two dummy components 120 are disposed one by one on both sides of the semiconductor chip 110. The length of each dummy component 120 in the longitudinal direction of the drawing is nearly equal to length "b" of the semiconductor chip 110 in the longitudinal direction.

FIG. 5B is a plan view of still another modified example of the semiconductor device 100 illustrated in FIG. 5A.

Each dummy component 120 herein has a size smaller than that illustrated in FIG. 5A. However, the dummy components 120 herein, increased in the number of disposition, may be disposed so as to assimilate the overall contour of each dummy component 120 illustrated in FIG. 5A.

In this embodiment, by disposing the dummy components 120 so as to ensure a good positional balance relative to the planar geometry of the interposer 106, any unbalance in stress apprehensive for the interposer 106 when only the semiconductor chip 101 is disposed may be resolved, and thereby the interposer 106 may be prevented from asymmetrically warping. As a consequence, unbalanced warping of the semiconductor device 100 due to thermal load may be reduced, and thereby a package structure excellent in the reliability of mounting may be provided.

In particular for the case where the semiconductor chip has a rectangular planar geometry, lifetime of solder connection at the center of the semiconductor chip tends to degrade as compared with square semiconductor chip. This is supposedly because warping in the longitudinal direction (in the direction of longer edge) of the rectangular semiconductor chip may be relatively larger, as compared with that in the square semiconductor chip.

In this embodiment, for the case where the semiconductor chip 106 is disposed so as to possibly produce unbalanced stress to the interposer 106, due to the geometry of the semiconductor chip 110 and location of the semiconductor chip 110, the second outer circumferential region 124 is set so as to moderate such unbalance, and so as to allow therein appropriate disposition of the dummy components 120, but outside an area having the semiconductor device 100 disposed therein. By reducing the unbalanced warping of the interposer 106 in this way, the reliability in mounting of the interposer 106 onto the mounting substrate 102 may be improved. Since only appropriate disposition of the dummy components 120 in the second outer circumferential region 124 will suffice, so that any known passive components may be adoptable as the dummy components 120. Also a silicon material or ceramic material assimilating the semiconductor chip 110 may be adoptable as the dummy components 120. By using this sort of material, not only the reliability of connection, but also heat radiation characteristics and electrical characteristics may be improved. Also in this case, by controlling the cut size corresponding to the geometries of the semiconductor chip 110 and the second outer circumferential region 124, the dummy components may freely and readily be obtained. Thus-obtained dummy components may be mounted by a process similar to that adopted to the chip mounting. The semiconductor device 100 may, therefore, be manufactured at low cost.

Second Embodiment

Figure 6A:
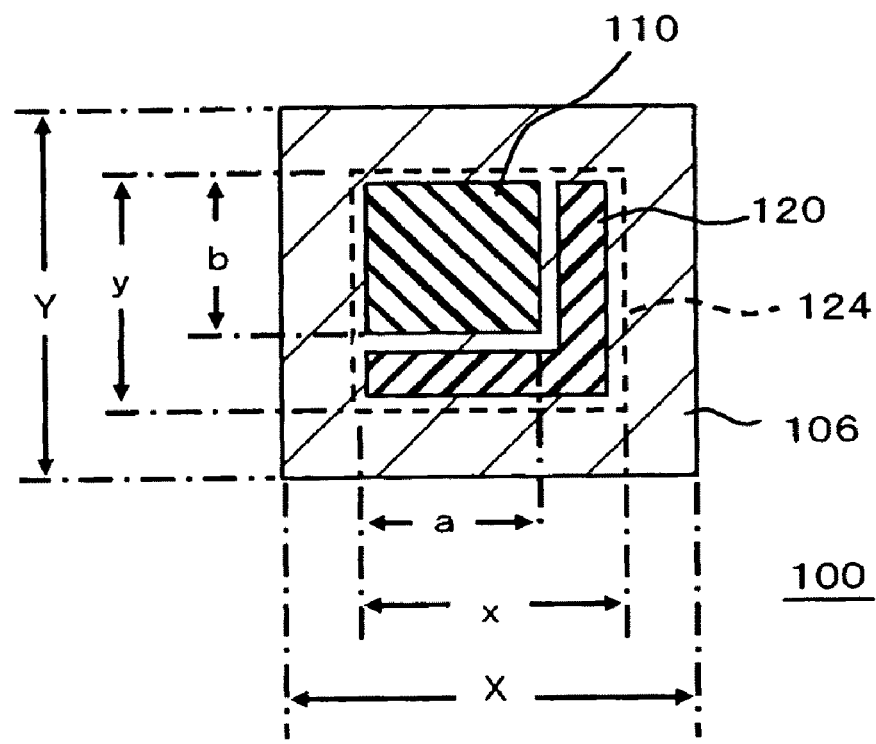
FIGS. 6A and 6B are plan views illustrating a configuration of a semiconductor device according to another embodiment of the present invention.
Figure 6B:
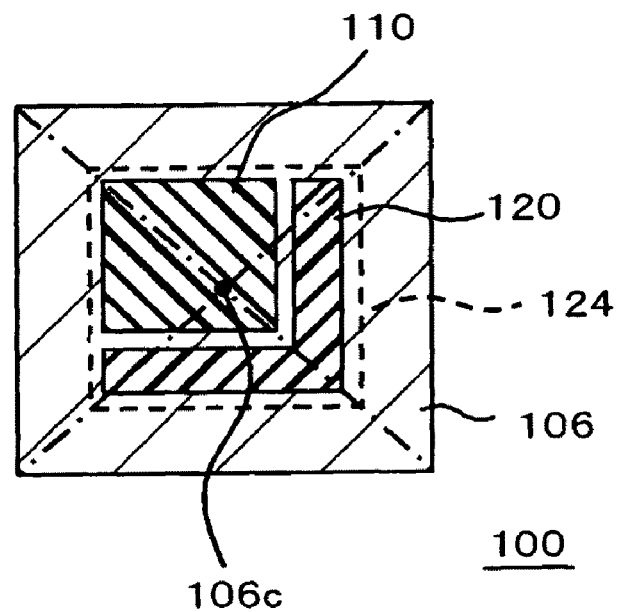

FIGS. 6A and 6B are plan views illustrating a configuration of the semiconductor device 100 in this embodiment. FIG. 6A illustrates dimensions of the individual constituents of the semiconductor device 100. FIG. 6B illustrates the center 106c of the interposer 106. In this embodiment, the dimension of the semiconductor chip 110 and the location thereof over the interposer 106 are different from those in the first embodiment.

In this embodiment, the semiconductor chip 110 has a geometry analogous to that of the interposer 106 in a plan view, while aligning the longitudinal direction thereof in the same direction. In other words, the relation X:Y=a:b is satisfied. On the other hand, the center of the semiconductor chip 110 in this embodiment does not coincide with the center 106c of the interposer 106. In this configuration, disposition of only of the semiconductor chip 110 over the interposer 106 may result in unbalanced stress exerted by the semiconductor chip 110 to the interposer 106.

In this embodiment, in order to moderate the unbalanced stress, one dummy component 120 is disposed over the interposer 106 alongside of the semiconductor chip 110. The dummy component 120 may be disposed so as to make the second circumferential region 124, defined by the outer circumference which surrounds the semiconductor chip 110 and the dummy component 120, have a geometry analogous to that of the interposer 106 in a plan view while aligning the longitudinal direction thereof in the same direction, and so as to make the center of the second circumferential region 124 coincident with the center of the interposer 106. In this embodiment, the second outer circumferential region 124 has length x in the transverse direction of the drawing, and has length y in the longitudinal direction. The second outer circumferential region 124 may be set so as to satisfy the relation X:Y=x:y. By this setting, the center of the second outer circumferential region 124 may be made coincide with the center of the interposer 106, as illustrated in FIG. 6B.

Next, procedures of designing the semiconductor device 100 of this embodiment will be explained referring to FIGS. 7A to 7C.

Figure 7A:
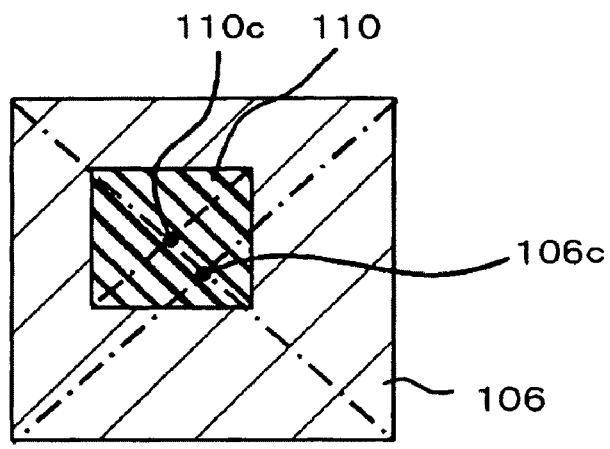
FIGS. 7A to 7C are drawings explaining procedures of designing the semiconductor device according to the embodiment of the present invention.
Figure 7B:
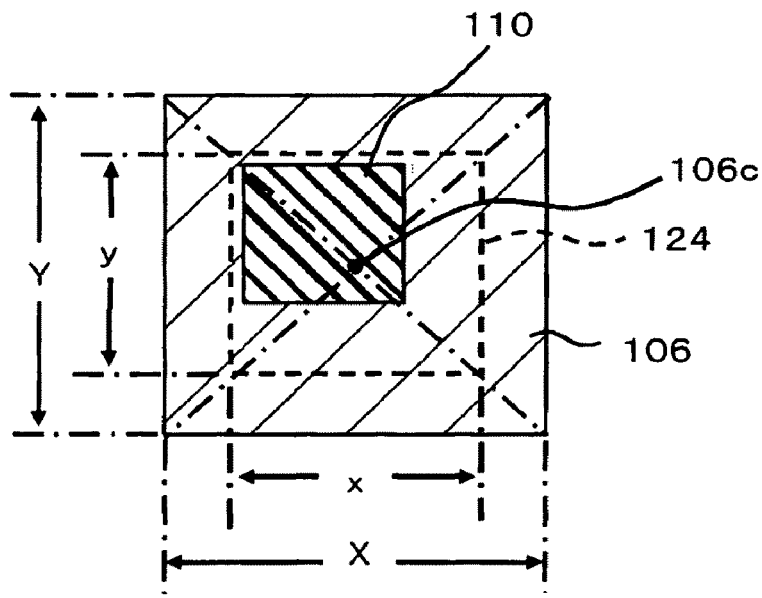
Figure 7C:
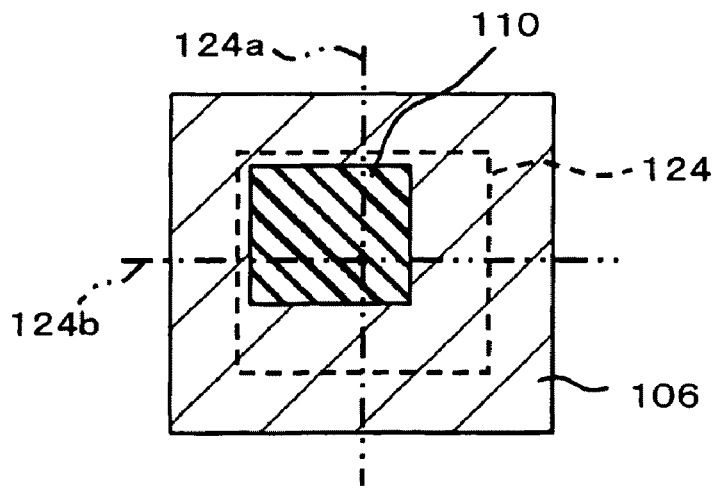

FIG. 7A is a drawing schematically illustrating the individual planar geometries of the interposer 106 and the semiconductor chip 110, and a positional relation between the interposer 106 and the semiconductor chip 110. The center 106c of the interposer 106 herein does not coincide with the center 110c of the semiconductor chip 110. Hence, the second outer circumferential region 124 allowing therein disposition of the dummy component will be set. FIG. 7B is a drawing illustrating a state of setting of the second outer circumferential region 124. More specifically, in this embodiment, the second outer circumferential region 124 may be set so as to make the center thereof coincide with the center 106c of the interposer 106, so as to satisfy the relation X:Y=x:y, and so as to enclose the first outer circumferential region (the area allowing disposition of the semiconductor chip 110). The second outer circumferential region 124 may have a minimum size capable of enclosing the first outer circumferential region.

Next, a setting is made so as to dispose the dummy component 120 in the second outer circumferential region 124 but outside the first outer circumferential region. Also in this embodiment, the semiconductor chip 110 or the dummy component 120 may preferably be disposed over the region extended up to the outer edges of the second outer circumferential region 124, on the first center line 124a and on the second center line 124b of the second outer circumferential region 124. In this embodiment, the dummy component 120 may have an L-shape which lies across the first center line 124a and the second center line 124b.

FIG. 8 is a plan view illustrating a modified example of the semiconductor device 100 illustrated in FIGS. 6A and 6B.

Figure 8A:
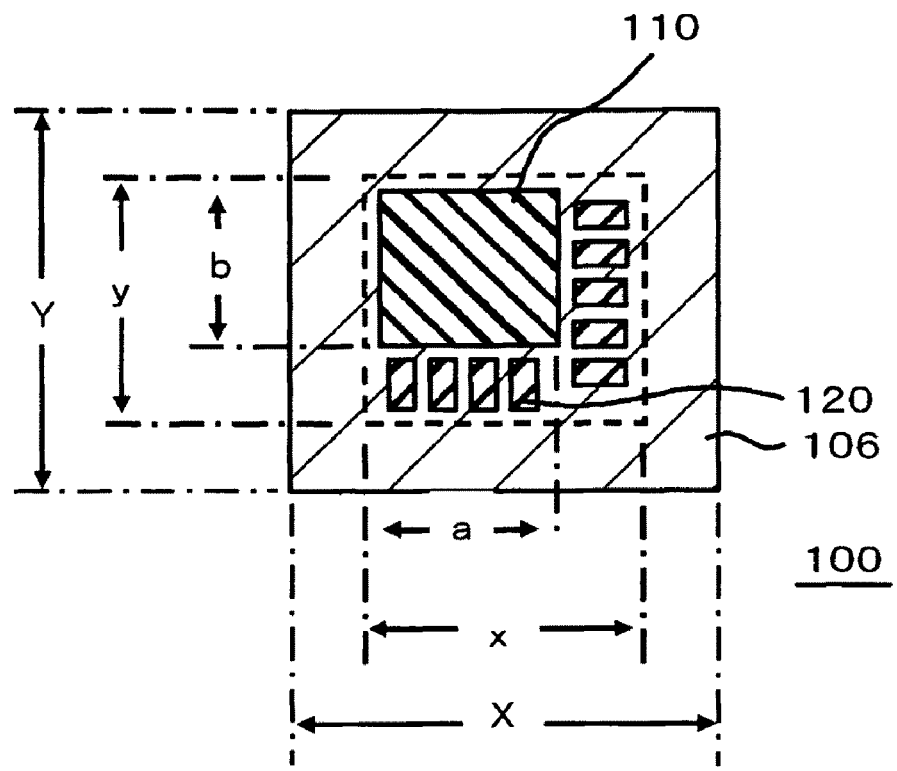
FIGS. 8A and 8B are plan views illustrating modified examples of the semiconductor device illustrated in FIGS. 6A and 6B.
Figure 8B:
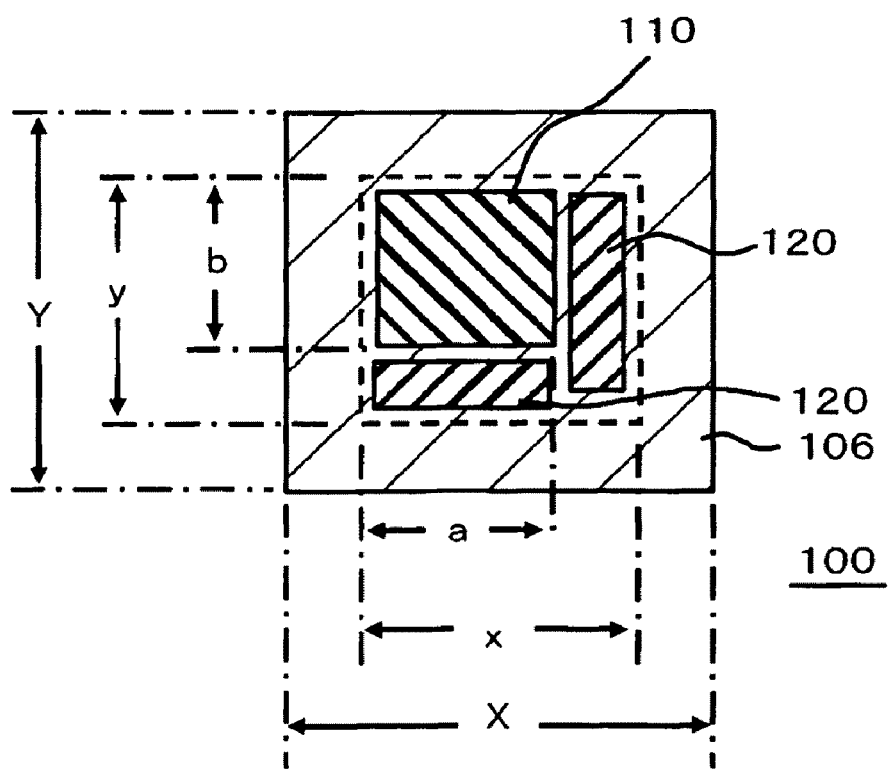

FIGS. 6A and 6B illustrated the example having the L-shape dummy component 120 disposed in the second outer circumferential region 124 but outside the first outer circumferential region, meanwhile a plurality of small dummy components 120 may be arranged in an L-shape as illustrated in FIG. 8A. Alternatively, two straight dummy components 120 may be arranged in an L-shape, as illustrated in FIG. 8B.

Also in this embodiment, effects similar to those in the first embodiment may be obtained.

Third Embodiment

Figure 9A:
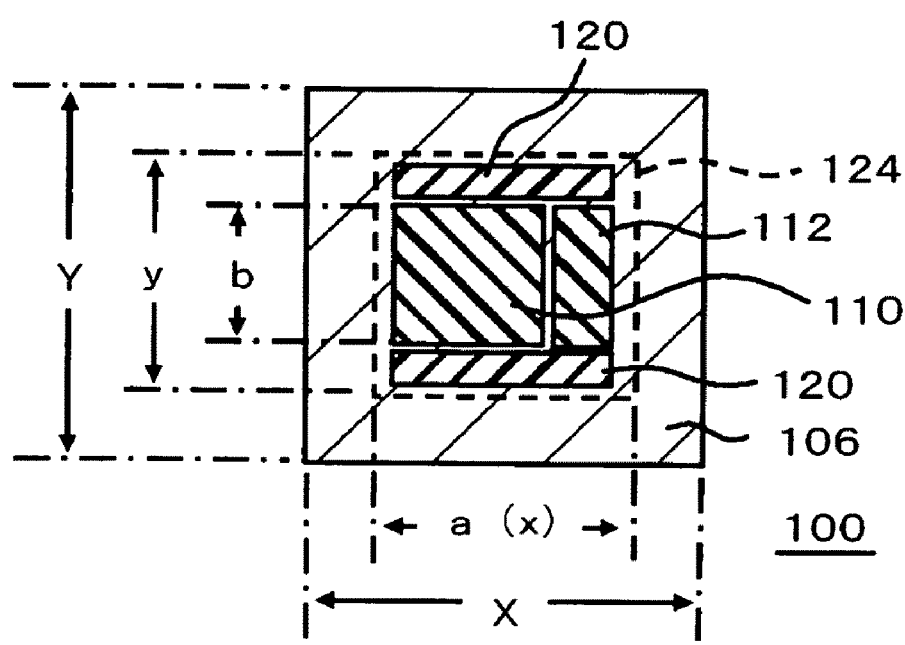
FIGS. 9A and 9B are plan views illustrating a configuration of a semiconductor device according to still another embodiment of the present invention.
Figure 9B:
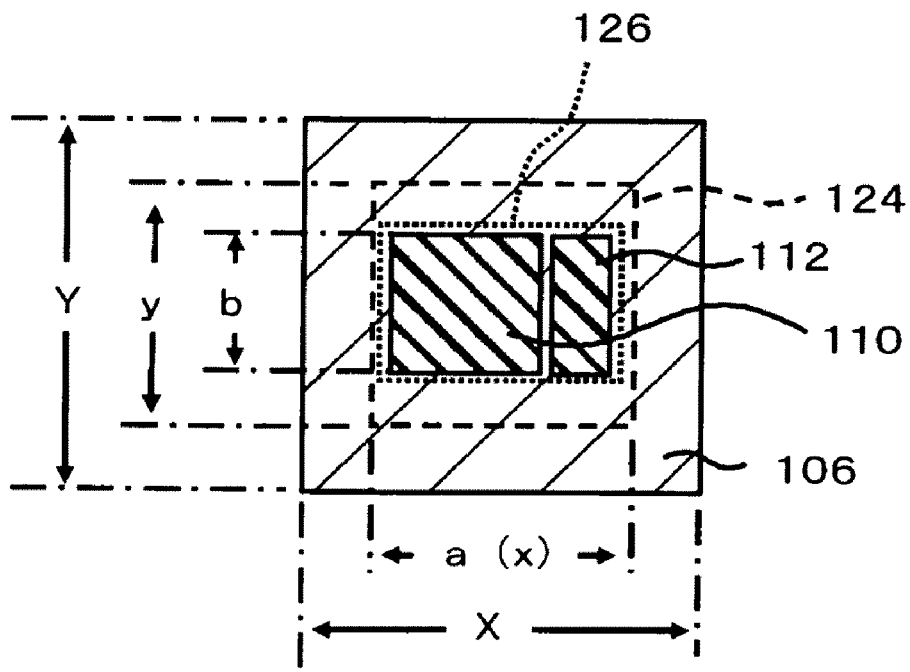

FIGS. 9A and 9B are plan views illustrating a configuration of the semiconductor device 100 of this embodiment. In this embodiment, the semiconductor device 100 further includes a semiconductor chip 112, in addition to the semiconductor chip 110 explained in the first embodiment and so forth. In this embodiment, the semiconductor device 100 may be given as a SiP (system in package) having a plurality of semiconductor chip mounted therein.

The semiconductor chip 110 and the semiconductor chip 112 are disposed side by side. In this embodiment, as illustrated in FIG. 9B, the first outer circumferential region 126 may be given as an area which surrounds the semiconductor chip 110 and the semiconductor chip 112 disposed over the interposer 106. The first outer circumferential region 126 has length "a" in the transverse direction of the drawing, and has length "b" in the longitudinal direction. The first outer circumferential region 126 herein does not have a shape analogous to that of the interposer 106 in a plan view. In other words, the relation X:Y=a:b is not satisfied. In this sort of configuration, disposition of only of the semiconductor chip 110 and the semiconductor chip 112 over the interposer 106 may result in unbalanced stress exerted by the semiconductor chip 110 and the semiconductor chip 112 to the interposer 106.

Therefore, also in this embodiment, the dummy components 120 are disposed over the interposer 106. The second outer circumferential region 124 may be set similarly to as described in the first embodiment. The second outer circumferential region 124 has length x=a in the transverse direction, and length y in the longitudinal direction. Length y herein may be set so as to satisfy the relation X:Y=a:y.

Figure 10:
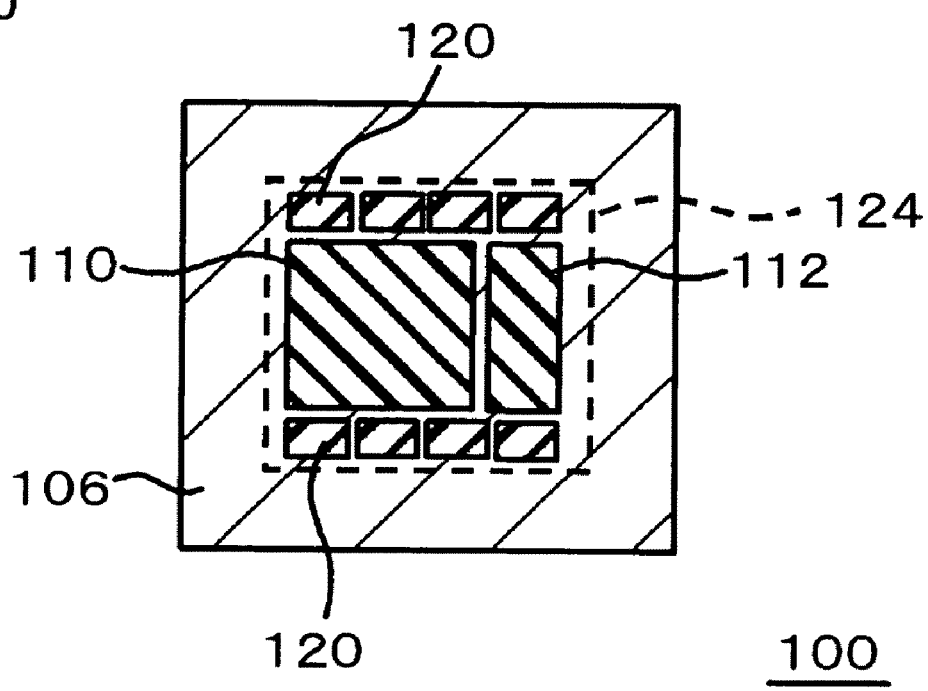
FIG. 10 is a plan view illustrating a modified example of the semiconductor device illustrated in FIGS. 9A and 9B.

FIG. 10 is a plan view illustrating a modified example of the semiconductor device 100 illustrated in FIGS. 9A and 9B.

Each dummy component 120 herein has a size smaller than that illustrated in FIG. 9A. However, the dummy components 120 increased in the number of disposition may be disposed so as to assimilate the overall contour of each dummy component 120 illustrated in FIG. 9A. For an exemplary case where passive components such as capacitors are used as the dummy components, a plurality of dummy components may be disposed so as to fit them to the geometry of the unoccupied area of the second outer circumferential region 124.

Figure 11:
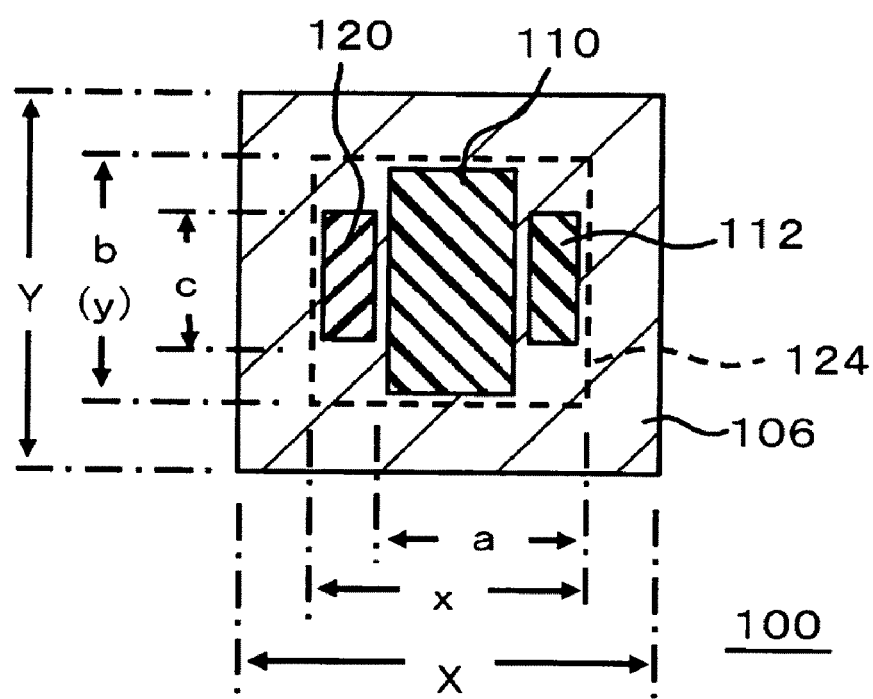
FIG. 11 is a plan view illustrating another example of the semiconductor device according to the embodiment of the present invention.
Figure 12A:
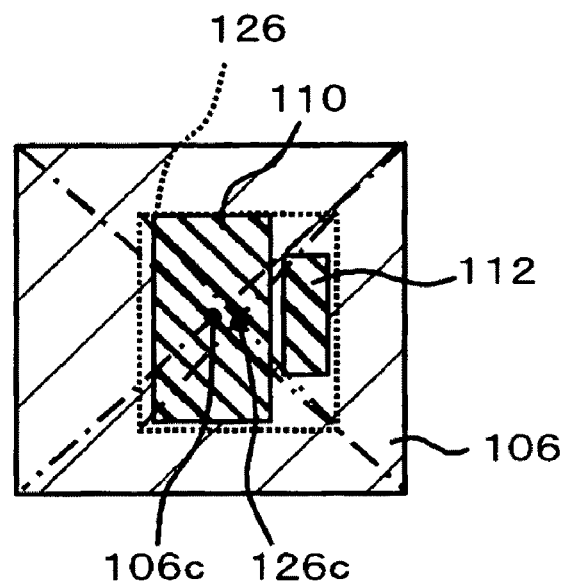
FIGS. 12A and 12B are plan views illustrating still another example of the semiconductor device according to the embodiment of the present invention.
Figure 12B:
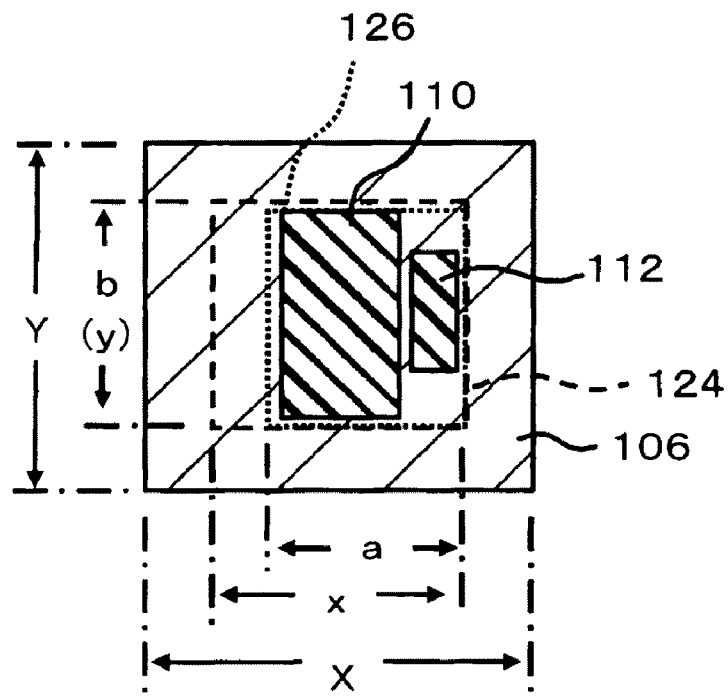

FIG. 11 and FIGS. 12A and 12B are plan views illustrating another example of the semiconductor device 100 of this embodiment.

Also in this example, the semiconductor device 100 contains the semiconductor chip 110 and the semiconductor chip 112. The semiconductor chip 110 herein has length "b" in the longitudinal direction, and the semiconductor chip 112 has length "c" in the longitudinal direction (c<b). As illustrated FIG. 12B, the first outer circumferential region 126 which surrounds the semiconductor chip 110 and the semiconductor chip 112 has length "a" in the transverse direction and has length "b" in the longitudinal direction. The geometry of the first outer circumferential region 126 is not analogous to that of the interposer 106, while aligning the longitudinal direction thereof in the same direction. That is, the relation X:Y=a:b is not satisfied.

As illustrated in FIG. 12A, the center 126c of the first outer circumferential region 126 and the center 106c of the interposer 106 do not coincide. Now, again in this example, the dummy component 120 is disposed over the interposer 106.

The second outer circumferential region 124 may be set similarly to as explained in the first embodiment. The second outer circumferential region 124 has length x in the transverse direction, and has length y=b in the longitudinal direction. Length x herein may be set so as to satisfy the relation X:Y=x:b. The dummy component 120 may have the longitudinal length equal to longitudinal length c of the semiconductor chip 112. By this configuration, an area having the semiconductor chip 110, the semiconductor chip 112, and the dummy component 120 disposed therein, may be made symmetrical about both of the first center line of the second outer circumferential region 124 in the longitudinal direction, and the second center line in the transverse direction.

Figure 13:
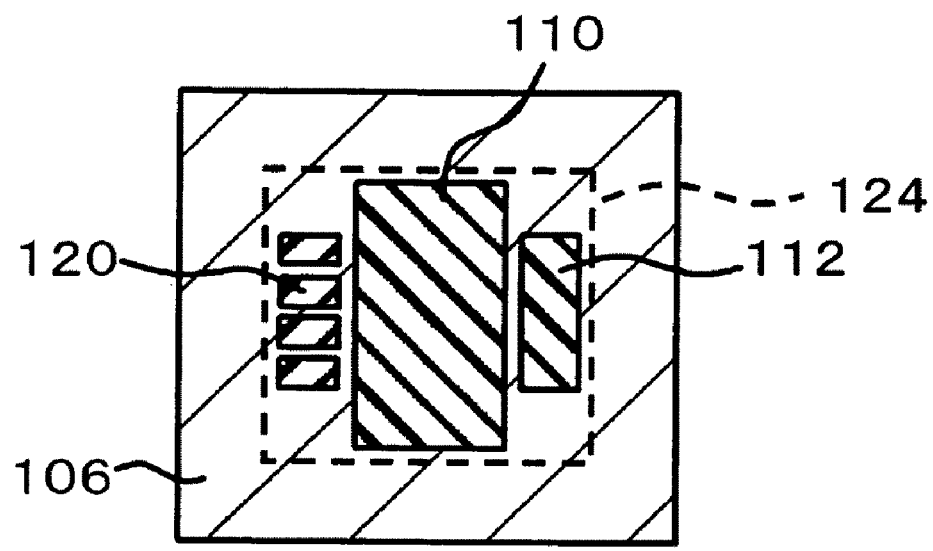
FIG. 13 is a plan view illustrating a modified example of the semiconductor device illustrated in FIG. 11.

Alternatively, as illustrated in FIG. 13, a plurality of small dummy components 120 may be provided.

Effects similar to those obtained in the first embodiment may be obtained also in this embodiment.

Fourth Embodiment

Figure 14A:
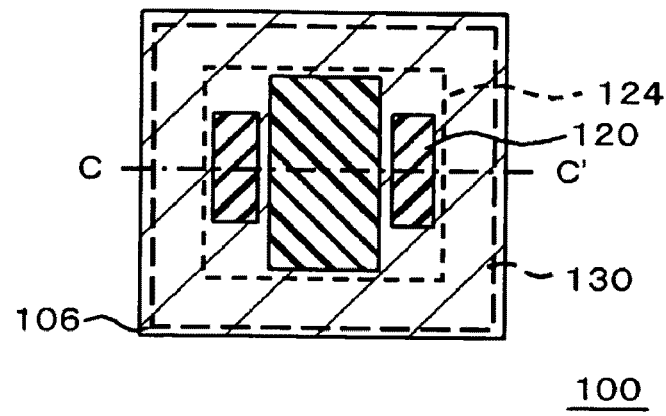
FIGS. 14A to 14C are drawings illustrating other examples of a semiconductor device according to still another embodiment of the present invention.
Figure 14B:
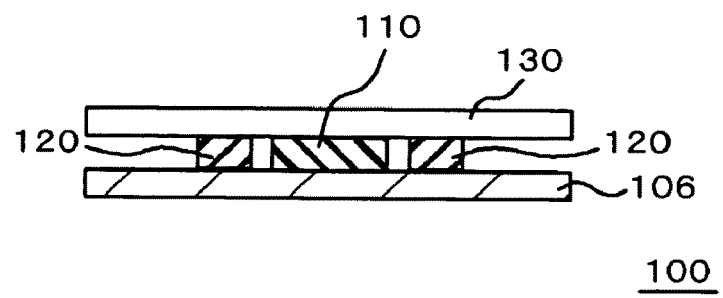
Figure 14C:
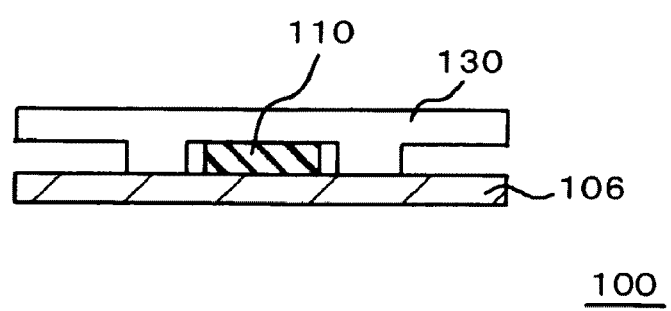

FIGS. 14A to 14C illustrate configurations of the semiconductor device 100 in this embodiment.

FIG. 14A is a plan view, and FIG. 14B and FIG. 14C are sectional views taken along line C-C' in FIG. 14A.

In this embodiment, the semiconductor device 100 may be configured to further contain a radiator plate 130 provided over the interposer 106, and over at least either one of the semiconductor chip 110 and the dummy components 120, while being bonded to at least either one of them. The radiator plate 130 functions also as a reinforcing plate.

FIG. 14B illustrates an example having the dummy components 120, similar to those described in the first embodiment provided over the interposer 106, and having the radiator plate 130 provided thereon. The drawing herein does not illustrate the mounting substrate 102 and the solder balls 104. The radiator plate 130 may be configured by using a metal material such as copper, nickel or the like. The radiator plate 130 may be bonded to the semiconductor chip 110 and the dummy component 120 by using an adhesive such as heat-conductive adhesive, electro-conductive adhesive or the like.

The drawing herein illustrates an example where both of the semiconductor chip 110 and the dummy components 120 are bonded to the radiator plate 130, meanwhile the semiconductor device 100 may be configured to have only either one of the semiconductor chip 110 and the dummy components 120 bonded to the radiator plate 130. One possible configuration may be such as having the radiator plate 130 adhered to at least either one of the surface of the semiconductor chip 110 opposite to that opposed to the interposer 106, and the surface of the dummy component 120 opposite to that opposed to the interposer 106. For an exemplary case where the height of the semiconductor chip 110 is smaller than the height of the dummy components 120, the radiator plate 130 may be bonded only to the dummy components 120.

FIG. 14C illustrates an exemplary case provided, over the interposer 106, with the radiator plate 130 which is composed of the same material with the dummy components 120, and formed while being integrated with the dummy components 120.

Although only a single example has been described in the above, the configuration having the radiation plate 130 may be adoptable also to the individual semiconductor devices 100 explained in the first to third embodiments.

Effects similar to those obtained in the first embodiment may be obtained also in this embodiment. Provision of the radiator plate 130 may be contributive also to improvement in the thermal characteristics.

(Results of Simulation)

Using general simulation software based on the finite element method (FEM), net increase in non-elastic deformation energy density of a solder material, applied with a viscoplastic material, per one cycle obtained under a temperature cycle load was extracted, and the lifetime of the individual balls was calculated based on a lifetime curve preliminarily obtained on the material basis.

The simulation was conducted according to the conditions below.

Example 1

Figure 19:
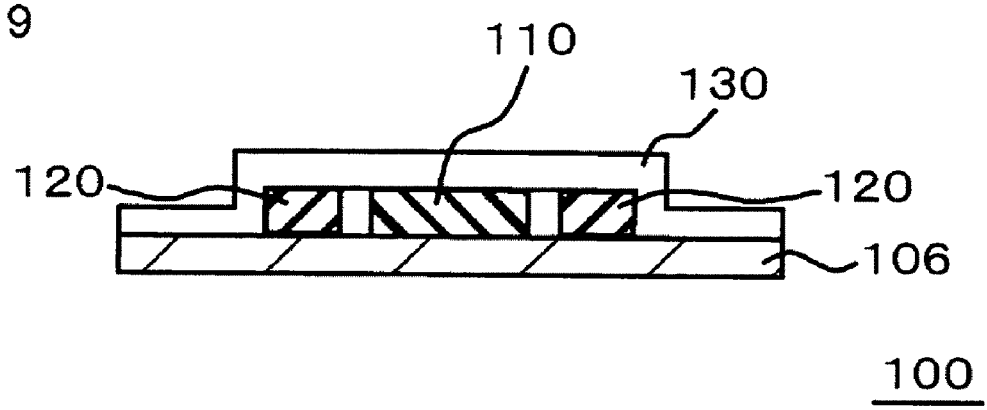
FIG. 19 is a sectional view schematically illustrating a configuration of a semiconductor device calculated by the simulation.

A simulation was made on the semiconductor device 100 provided with the radiator plate 130 similarly to as explained in the fourth embodiment referring to FIG. 14B, the circumference of the radiator plate 130 being bonded to the interposer 106. FIG. 19 schematically illustrates the configuration of the semiconductor device 100 used for the simulation.

The semiconductor chip 110 was given in a size of 10×6 mm, the interposer 106 was given in a size of 21×21 mm, and the dummy components 120 were given in a size of 6×1.5 mm. The distance between the semiconductor chip 110 and the dummy components 120 were adjusted to 0.5 mm, so as to give the second outer circumferential region 124 in a size of 10 mm both in the longitudinal and transverse directions. The dummy components 120 were hypothetically configured by the same material with the semiconductor chip 110.

Example 2

The semiconductor device 100 was configured similarly to as described in Example 1, except that the dummy components 120 were not provided.

First, based on a chart of distribution of cumulative non-elastic deformation energy density of the solder balls 104, the non-elastic deformation energy density per one cycle was extracted for each category of the solder balls 104, and the lifetime was calculated. The lifetime was calculated for each category of the solder balls 104, while assuming the referential shortest lifetime of the semiconductor chip 110 as 1000 cyc.

Figure 16A:
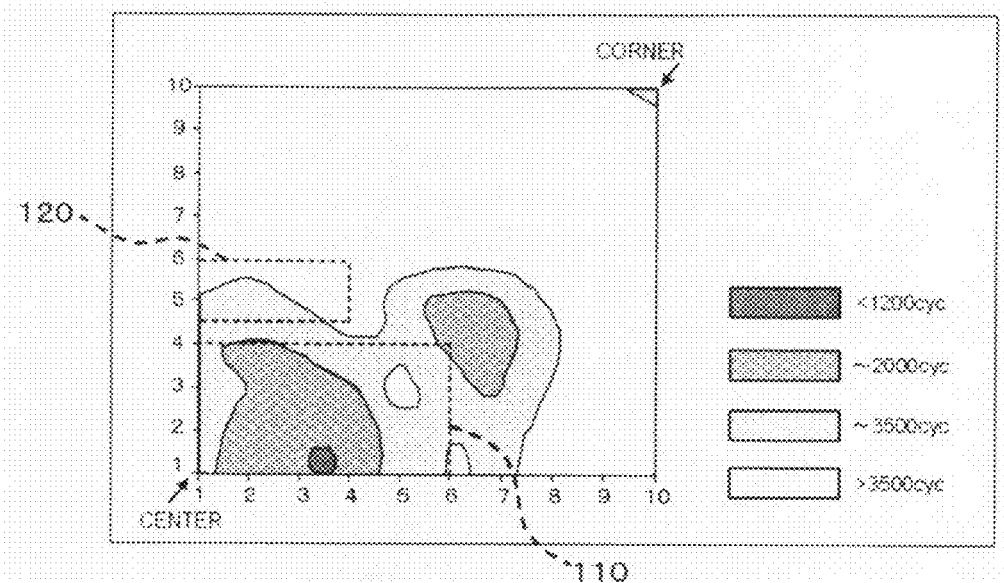
FIGS. 16A and 16B are drawings illustrating, by contour lines, distributions of lifetime calculated by a simulation.
Figure 16B:
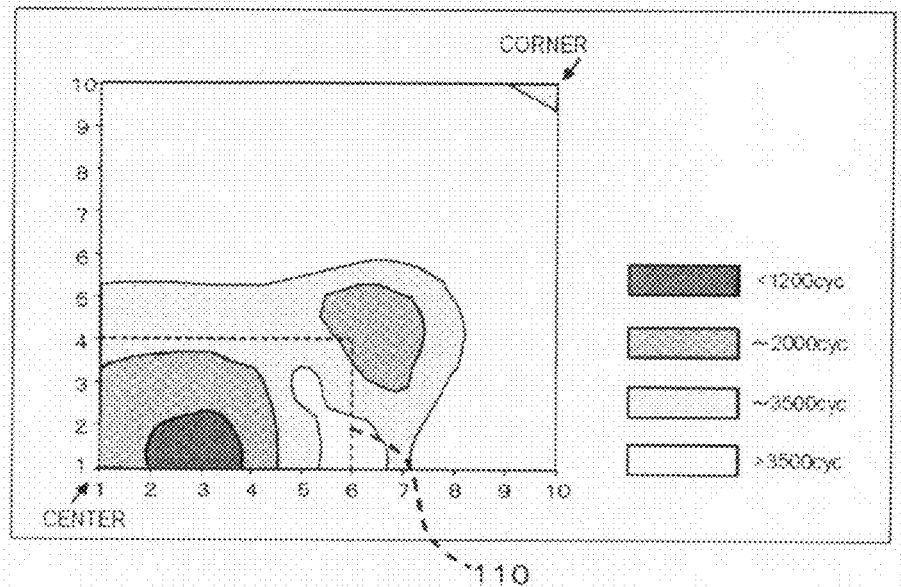

FIGS. 16A and 16B are drawings illustrating, by contour lines, distributions of the lifetime calculated as described in the above. Note that FIGS. 16A and 16B illustrate the longitudinal direction and the transverse direction in an inverted manner from those in FIG. 14B. FIG. 16A shows the result of Example 1 and 16B shows the result of Example 2. FIG. 17 is a drawing listing lifetime of solder at individual portions.

It is known from comparison between Examples 1 and 2 illustrated in FIGS. 16A, 16B and FIG. 17, that Example 1 provided with the dummy components 120 was improved in the lifetime by approximately 20% from that in Example 2. It is also found that Example 1 was improved in the lifetime at the center of the semiconductor device 100 approximately 1.7 times as compared with Example 2. As is known from the above, an effect of improving the lifetime of solder by the dummy components 120 was confirmed.

Figure 18A:
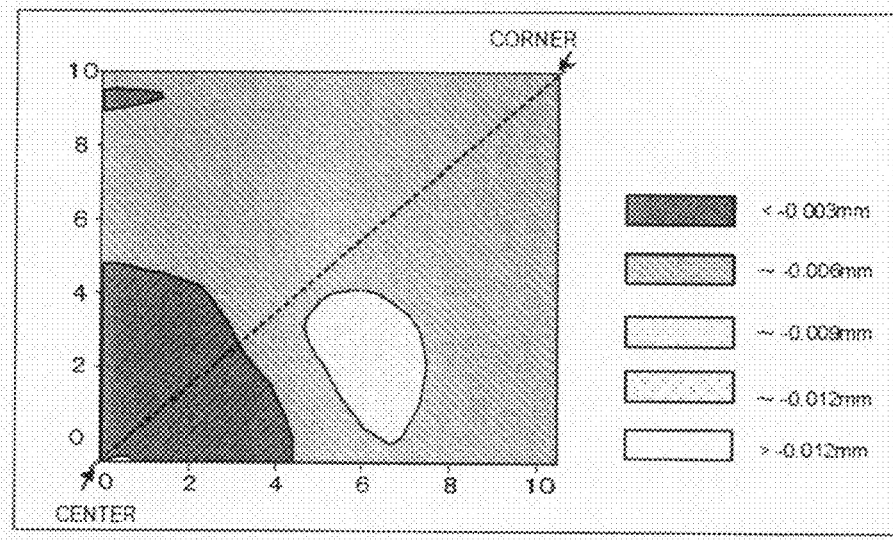
FIGS. 18A and 18B are drawings illustrating distributions of warping in the height-wise direction of an interposer calculated by the simulation.
Figure 18B:
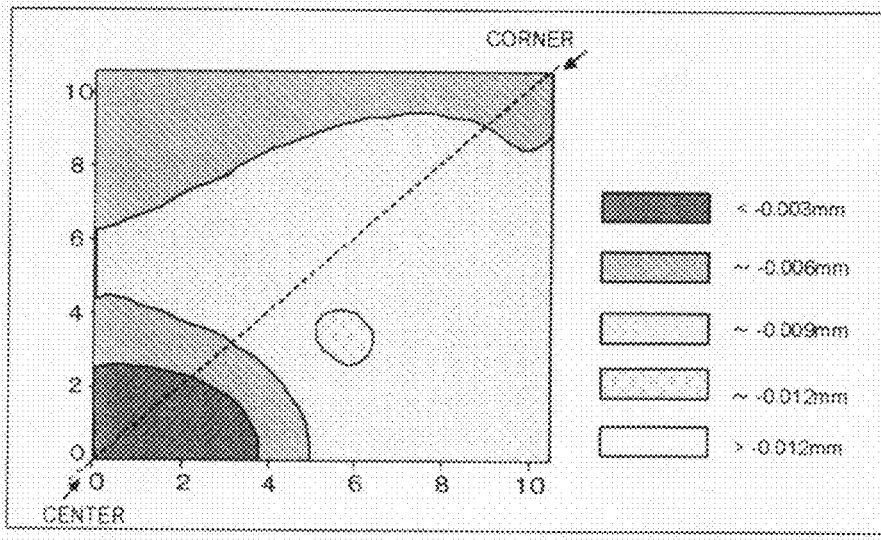

FIGS. 18A and 18B are drawings illustrating distributions of warping in the height-wise direction of the interposer 106. Also FIGS. 18A and 18B illustrate the longitudinal direction and the transverse direction in an inverted manner from those in FIG. 14B.

In Example 2, the distribution of warping is found to be asymmetrical about a diagonal line passing through the center and a corner of the semiconductor device 100 as shown in FIG. 18B. In contrast, in Example 1, the warping is found to change into symmetrical about the diagonal line at the center of the semiconductor device 100 as shown in FIG. 18A. In short, the local warping, which possibly generates when the semiconductor chip 110 has a rectangular geometry or when the semiconductor chip 110 is not disposed at the center of the interposer 106, may be prevented by disposing the dummy components 120.

It is supposed from the results of simulation that, even if the semiconductor chip has a rectangular geometry, various warping or stress observed in the process of temperature cycle test may be approximated to behaviors observed when the semiconductor chip has a square geometry, by disposing the dummy components 120 alongside of the semiconductor chip.

The embodiments of the present invention having been described in the above referring to the attached drawings are simply for exemplary purposes, and allow adoption of any configurations other than those described in the above.

Figure 15A:
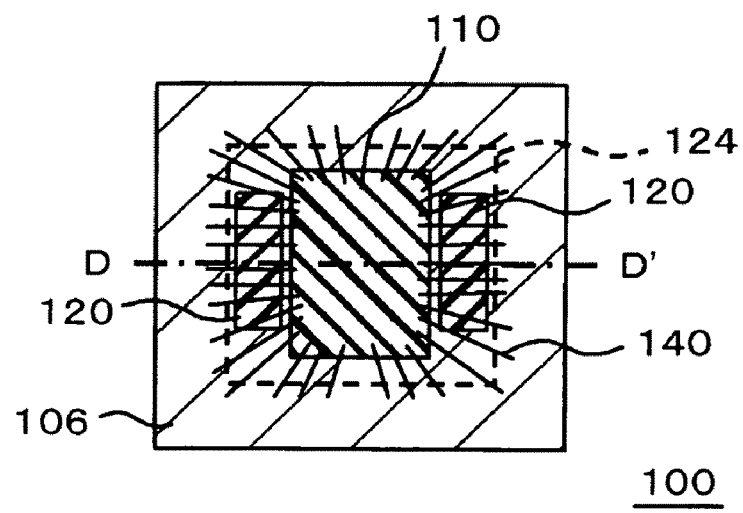
FIGS. 15A and 15B are drawings illustrating an example of connection of a semiconductor chip through bonding wires to an interposer.
Figure 15B:
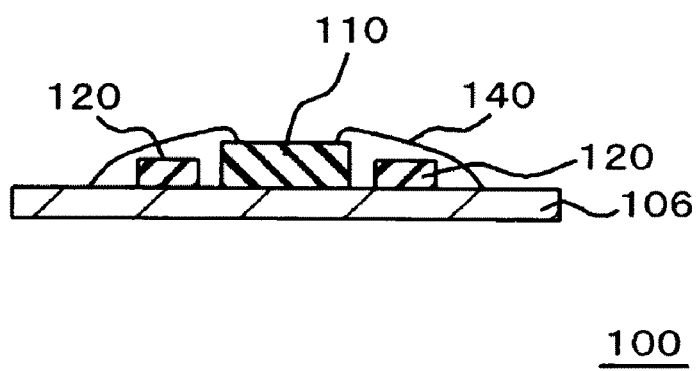

The semiconductor chips, bonded in the above-described embodiments by flip-chip bonding to the interposer 106, may be bonded to the interposer 106 alternatively by wire bonding. FIG. 15 is a drawing illustrating an example of the semiconductor chip 110 bonded to the interposer 106 with bonding wires 140. In this configuration, the dummy component 120 may preliminarily be disposed in the second outer circumferential region 124, before the bonding wires 140 are formed.

The bonding wires 140, illustrated in FIG. 15 so as to be connected to the area of the interposer 106 but outside the second outer circumferential region 124, may alternatively be connected to the interposer 106 within the second outer circumferential region 124.

The interposer 106, having been described in the embodiments so as to satisfy the relation X>Y, may alternatively have a square planar geometry (length X=length Y). In this case, the dummy components 120 may be disposed so as to make an area, having the semiconductor chip 110 and the dummy component 120 disposed therein, show 90° rotational symmetry about the center of the second outer circumferential region 124. By this configuration, unbalanced stress possibly exerted to the interposer 106 may be moderated in a desirable manner.

It is apparent that the present invention is not limited to the above embodiment, that may be modified and changed without departing from the scope and spirit of the invention.

What is claimed is:

1. A semiconductor device comprising:
    an interposer having a rectangular planar geometry with length X for a first edge and length Y for a second edge orthogonal to said first edge;
    a semiconductor chip disposed over said interposer; and
    a dummy component disposed over said interposer, alongside of said semiconductor chip,
    wherein the center of a first outer circumferential region, which surrounds said semiconductor chip over said interposer, and has length "a" for a third edge lying in parallel with said first edge, and length "b" for a fourth edge orthogonal to said third edge, does not coincide with the center of said interposer, or equation X:Y=a:b is not satisfied, and
    the center of a second outer circumferential region, which surrounds said first outer circumferential region and said dummy component disposed over said interposer, and has length "x" for a fifth edge lying in parallel with said first edge, and length "y" for a sixth edge orthogonal to said fifth edge, coincides with the center of said interposer, and equation X:Y=x:y is satisfied.

2. The semiconductor device as claimed in claim 1, wherein said dummy component are disposed so as to make an area, having said dummy component and said semiconductor chip disposed therein, symmetrical about both of a first center line of said interposer and a second center line orthogonal to said first center line, in a plan view.

3. The semiconductor device as claimed in claim 1, having a plurality of said semiconductor chips disposed over said interposer, and
said first outer circumferential region surrounds said plurality of semiconductor chips.

4. The semiconductor device as claimed in claim 1, wherein said dummy component is any one of passive component, dummy semiconductor chip, or component composed of a silicon, ceramic or metal material.

5. The semiconductor device as claimed in claim 1, further comprising a radiator plate provided over said interposer, and provided over at least either one of said semiconductor chip and said dummy component, while being bonded to at least either one of them.

6. The semiconductor device as claimed in claim 1, further comprising a radiator plate provided over said interposer, configured by the same material with said dummy component, and formed while being integrated with said dummy component.

* * * * *